(12) United States Patent
Xavier

(10) Patent No.: US 8,552,288 B2
(45) Date of Patent: Oct. 8, 2013

(54) PHOTOVOLTAIC MODULE WITH ADHESION PROMOTER

(75) Inventor: Grace Xavier, Fremont, CA (US)

(73) Assignee: SunPower Corporation, San Jose, CA (US)

( * ) Notice: Subject to any disclaimer, the term of this patent is extended or adjusted under 35 U.S.C. 154(b) by 790 days.

(21) Appl. No.: 12/577,622

(22) Filed: Oct. 12, 2009

(65) Prior Publication Data

US 2011/0083738 A1    Apr. 14, 2011

(51) Int. Cl.
 *H01L 31/0216* (2006.01)
 *H01L 31/0224* (2006.01)

(52) U.S. Cl.
 USPC ............. 136/259; 136/251; 136/256; 257/21; 438/26

(58) Field of Classification Search
 USPC ............ 136/251, 259, 244, 258, 261; 438/57, 438/61, 64
 See application file for complete search history.

(56) References Cited

U.S. PATENT DOCUMENTS

| | | | |
|---|---|---|---|
| 2005/0172996 A1* | 8/2005 | Hacke et al. | 136/256 |
| 2006/0207646 A1* | 9/2006 | Terreau et al. | 136/251 |
| 2008/0035198 A1 | 2/2008 | Teppe et al. | |
| 2008/0216887 A1* | 9/2008 | Hacke et al. | 136/244 |

* cited by examiner

*Primary Examiner* — Jennifer Michener
*Assistant Examiner* — Jayne Mershon
(74) *Attorney, Agent, or Firm* — Blakely Sokoloff Taylor Zafman LLP

(57) ABSTRACT

Photovoltaic modules with adhesion promoters and methods for fabricating photovoltaic modules with adhesion promoters are described. A photovoltaic module includes a solar cell including a first surface and a second surface, the second surface including a plurality of interspaced back-side contacts. A first glass layer is coupled to the first surface by a first encapsulating layer. A second glass layer is coupled to the second surface by a second encapsulating layer. At least a portion of the second encapsulating layer is bonded directly to the plurality of interspaced back-side contacts by an adhesion promoter.

11 Claims, 3 Drawing Sheets

PHOTOVOLTAIC MODULE WITH ADHESION PROMOTER

The invention described herein was made with Government support under contract number DE-FC36-07GO17043 awarded by the United States Department of Energy. The Government may have certain rights in the invention.

TECHNICAL FIELD

Embodiments of the present invention are in the field of renewable energy and, in particular, photovoltaic modules with adhesion promoters and methods for fabricating photovoltaic modules with adhesion promoters.

BACKGROUND

Photovoltaic modules may be used to package solar cells. Available arrangements and designs of such photovoltaic modules are diverse. One common approach is to form a laminate of multiple layers, the laminate encapsulating the solar cells. However, degradation of efficiency of the solar cells in such a photovoltaic module may occur if any one of the layers partially or entirely delaminates from an adjacent layer. Interlayer delamination in a photovoltaic module can also result in long term reliability problems when weak interfaces lead to voids which eventually become collection zones for moisture, potentially leading to corrosion of metal contacts and eventually becoming an electrical hazard.

DETAILED DESCRIPTION

Figures 1A, 1B:
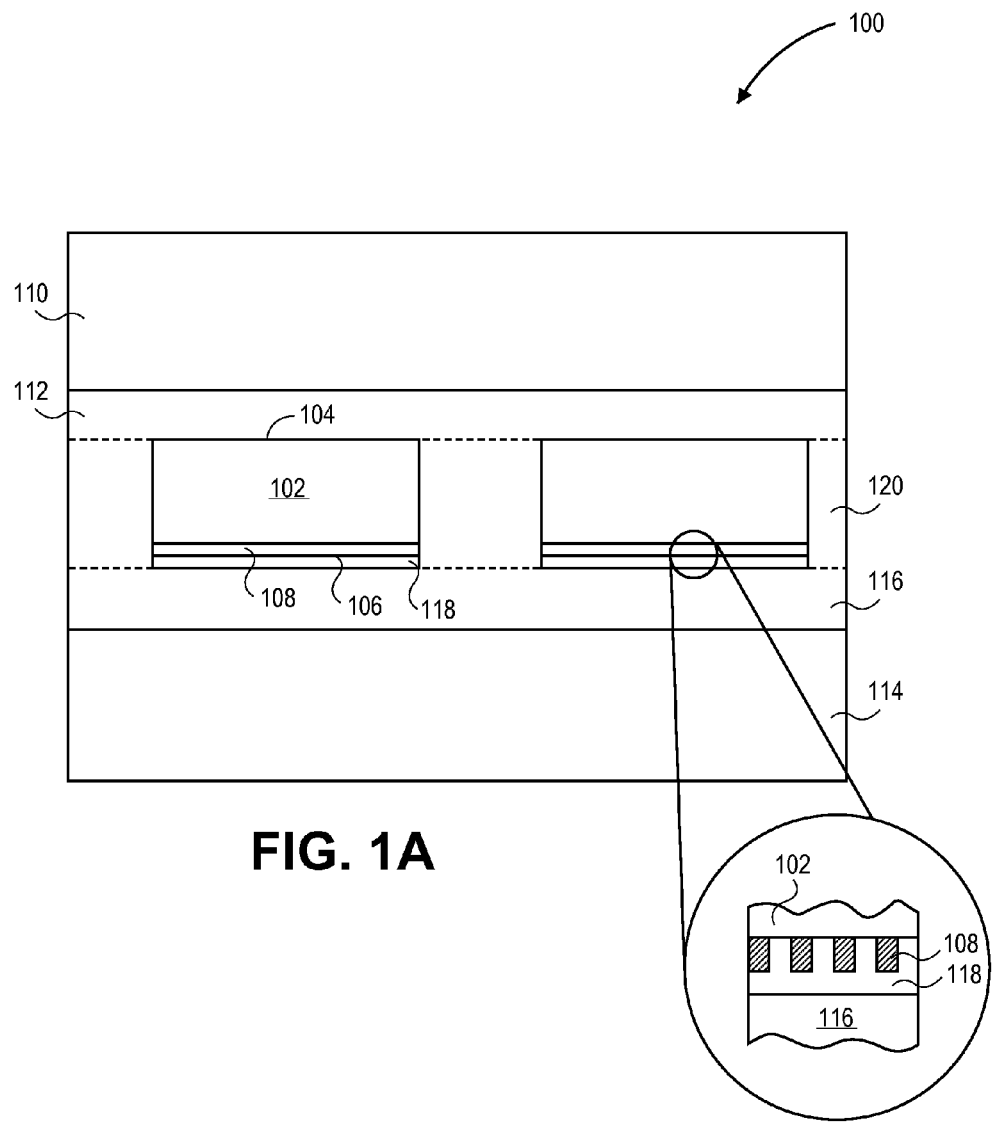
FIG. 1A illustrates a cross-sectional view of a photovoltaic module resistant to delamination, in accordance with an embodiment of the present invention.
FIG. 1B illustrates an expanded view of a portion of the cross-sectional view of the photovoltaic modules resistant to delamination illustrated in FIG. 1A, in accordance with an embodiment of the present invention.

Photovoltaic modules resistant to delamination and methods for fabricating photovoltaic modules resistant to delamination are described herein. In the following description, numerous specific details are set forth, such as specific forms molecular formulas, in order to provide a thorough understanding of the present invention. It will be apparent to one skilled in the art that embodiments of the present invention may be practiced without these specific details. In other instances, well-known fabrication techniques, such as methods of lamination, are not described in detail in order to not unnecessarily obscure embodiments of the present invention. Furthermore, it is to be understood that the various embodiments shown in the Figures are illustrative representations and are not necessarily drawn to scale.

Disclosed herein are photovoltaic modules with adhesion promoters. In one embodiment, a photovoltaic module includes a solar cell including a first surface and a second surface, the second surface including a plurality of interspaced back-side contacts. A first glass layer is coupled to the first surface by a first encapsulating layer. A second glass layer is coupled to the second surface by a second encapsulating layer. At least a portion of the second encapsulating layer is bonded directly to the plurality of interspaced back-side contacts by an adhesion promoter. In another embodiment, a photovoltaic module includes a solar cell including a first surface and a second surface, the second surface including a plurality of interspaced back-side contacts. The plurality of interspaced back-side contacts includes a metal such as, but not limited to, aluminum, silver, copper or tin. A glass layer is coupled to the first surface by a first encapsulating layer. A stiff layer is coupled to the second surface by a second encapsulating layer. At least a portion of the second encapsulating layer is bonded directly to the plurality of interspaced back-side contacts by an adhesion promoter composed of an aminosilane compound.

Also disclosed herein are methods for fabricating photovoltaic modules with adhesion promoters. In one embodiment, a method includes coupling, by a first encapsulating layer, a first glass layer to a first surface of a solar cell. The solar cell includes the first surface and a second surface, the second surface including a plurality of interspaced back-side contacts. The method further includes applying an adhesion promoter directly to the plurality of interspaced back-side contacts. The method further includes coupling, by a second encapsulating layer, a second glass layer to the second surface of the solar cell. The coupling includes bonding at least a portion of the second encapsulating layer directly to the adhesion promoter.

Photovoltaic modules composed of laminated layers may be used to package solar cells. In accordance with an embodiment of the present invention, an adhesion promoter is included directly between contacts of a solar cell and an encapsulating layer. In one embodiment, this manner of inclusion of the adhesion promoter in a photovoltaic module composed of laminated layers prevents partial or entire delamination of the encapsulating layer from the contacts of the solar cell. In one embodiment, the solar cell is a back-contact solar cell.

In an aspect of the present invention, photovoltaic modules resistant to delamination are described. FIG. 1A illustrates a cross-sectional view of a photovoltaic module resistant to delamination, in accordance with an embodiment of the present invention.

Referring to FIG. 1A, a photovoltaic module 100 includes a solar cell 102. Solar cell 102 includes a first surface 104 and a second surface 106, second surface 106 including a plurality of interspaced back-side contacts 108. A first glass layer 110 is coupled to first surface 104 by a first encapsulating layer 112. A second glass layer 114 is coupled to second surface 106 by a second encapsulating layer 116. At least a portion of second encapsulating layer 116 is bonded directly to the plurality of interspaced back-side contacts 108 by an adhesion promoter 118.

Adhesion promoter 118 may be composed of a material suitable to reduce or eliminate the likelihood of delamination between second encapsulating layer 116 and the plurality of interspaced back-side contacts 108. In accordance with an embodiment of the present invention, adhesion promoter 118 is composed of an aminosilane compound. In one embodiment, the aminosilane compound is Silquest A-1110 silane. In an embodiment, adhesion promoter 118 chemically bonds second encapsulating layer 116 to the plurality of interspaced back-side contacts 108. In an embodiment, the k-value of bond strength between second encapsulating layer 116 and the plurality of interspaced back-side contacts 108 is greater than approximately 45 Newtons per centimeter.

The arrangement of solar cell 102, the plurality of interspaced back-side contacts 108, adhesion promoter 118 and second encapsulating layer 116 may be an arrangement suitable to reduce or eliminate the likelihood of delamination between second encapsulating layer 116 and the plurality of interspaced back-side contacts 108. FIG. 1B illustrates an expanded view of a portion of the cross-sectional view of the photovoltaic modules resistant to delamination illustrated in FIG. 1A, in accordance with an embodiment of the present invention. Referring to FIG. 1B, in one embodiment, a layer of adhesion promoter 118 is applied to the plurality of interspaced back-side contacts 108 with a thickness sufficient to completely encompass the plurality of interspaced back-side contacts 108. However, in another embodiment, a thin layer of adhesion promoter 118 is applied to the plurality of interspaced back-side contacts 108 such that second encapsulating layer 116 is conformal with, and takes on the pattern of, the plurality of interspaced back-side contacts 108.

Specific features of photovoltaic module 100 may include a variety of arrangements and material compositions. For example, in an embodiment, the plurality of interspaced back-side contacts 108 is composed of a metal such as, but not limited to, aluminum, silver, copper or tin. In an embodiment, the first surface of the solar cell is free from contacts. In an embodiment, material 120 (depicted in FIG. 1) is composed of first encapsulating layer 112, second encapsulating layer 116, a combination thereof, or a third encapsulating material. In one embodiment, one of first encapsulating layer 112 or second encapsulating layer 116 is composed of a material such as, but not limited to, EVA, Ionomers, Polyolefins or silicones.

In another aspect of the present invention, photovoltaic module 100 is not limited to an arrangement including a second glass layer coupled to second surface 106 of solar cell 102. For example, referring again to FIG. 1A, in the context of another embodiment of the present invention, a photovoltaic module 100 includes a solar cell 102. Solar cell 102 includes a first surface 104 and a second surface 106, second surface 106 including a plurality of interspaced back-side contacts 108. The plurality of interspaced back-side contacts 108 is composed of a metal such as, but not limited to, aluminum, silver, copper or tin. A glass layer 110 is coupled to first surface 104 by a first encapsulating layer 112. A stiff layer 114 is coupled to second surface 106 by a second encapsulating layer 116. At least a portion of second encapsulating layer 116 is bonded directly to the plurality of interspaced back-side contacts 108 by an adhesion promoter 118 composed of an aminosilane compound.

In accordance with an embodiment of the present invention, the stiff layer is a glass layer. However, in another embodiment, the stiff layer is a plastic layer. In one embodiment, the aminosilane compound is Silquest A-1110 silane. In an embodiment, the aminosilane compound chemically bonds second encapsulating layer 116 to the plurality of interspaced back-side contacts 108. In an embodiment, the k-value of bond strength between second encapsulating layer 116 and the plurality of interspaced back-side contacts 108 is greater than approximately 45 Newtons per centimeter. In an embodiment, first surface 104 of solar cell 102 is free from contacts.

Figure 2:
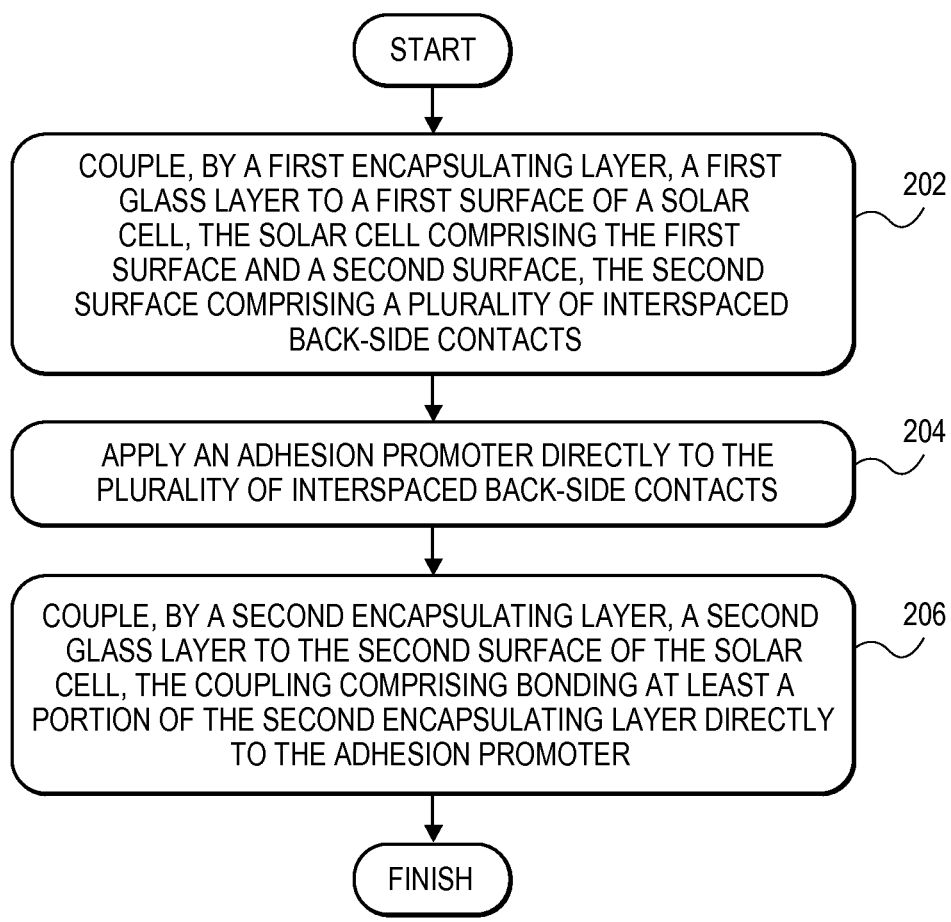
FIG. 2 illustrates a flowchart representing operations in a method of fabricating a photovoltaic module resistant to delamination, in accordance with an embodiment of the present invention.

In another aspect of the present invention, methods are provided for managing variability of output from photovoltaic systems. FIG. 2 illustrates a flowchart 200 representing operations in a method of fabricating a photovoltaic module resistant to delamination, in accordance with an embodiment of the present invention.

Referring to operation 202 of flowchart 200, a method of fabricating a photovoltaic module resistant to delamination includes coupling, by a first encapsulating layer, a first glass layer to a first surface of a solar cell. In accordance with an embodiment of the present invention, the solar cell includes the first surface and a second surface, the second surface including a plurality of interspaced back-side contacts.

In an embodiment, the plurality of interspaced back-side contacts is composed of a metal such as, but not limited to, aluminum, silver, copper or tin. In an embodiment, the first surface of the solar cell is free from contacts.

Referring to operation 204 of flowchart 200, the method of fabricating a photovoltaic module resistant to delamination further includes applying an adhesion promoter directly to the plurality of interspaced back-side contacts.

In accordance with an embodiment of the present invention, applying the adhesion promoter includes using a technique such as, but not limited to, spraying, dipping, brushing, or wiping. In one embodiment, applying the adhesion promoter includes applying an aminosilane compound. In a specific embodiment, applying the aminosilane compound includes applying Silquest A-1110 silane. In an embodiment, applying the adhesion promoter directly to the plurality of interspaced back-side contacts includes applying the adhesion promoter directly to a metal such as, but not limited to, aluminum, silver, copper or tin. In an embodiment, the adhesion promoter is included in an application medium composed of an organic alcohol.

Referring to operation 206 of flowchart 200, the method of fabricating a photovoltaic module resistant to delamination further includes coupling, by a second encapsulating layer, a second glass layer to the second surface of the solar cell. In accordance with an embodiment of the present invention, the coupling includes bonding at least a portion of the second encapsulating layer directly to the adhesion promoter. It is to be understood, however, that the method is not limited to coupling a second glass layer to the second surface of the solar cell. For example, in an alternative embodiment, a stiff layer such as, but not limited to, a plastic layer is used in place of a second glass layer.

In an embodiment, the adhesion promoter chemically bonds the second encapsulating layer to the plurality of interspaced back-side contacts. In an embodiment, the k-value of bond strength between the second encapsulating layer and the plurality of interspaced back-side contacts is greater than approximately 45 Newtons per centimeter. In an embodiment, subsequent to bonding the portion of the second encapsulating layer directly to the adhesion promoter, the photovoltaic module is resistant to delamination.

In an aspect of the present invention, an adhesion promoter may be hydrolyzed prior to, or at the time of, inclusion in a photovoltaic module. For example, FIG. 3 illustrates a chemical reaction scheme for the hydrolysis of an adhesion promoter, in accordance with an embodiment of the present invention.

Figure 3:
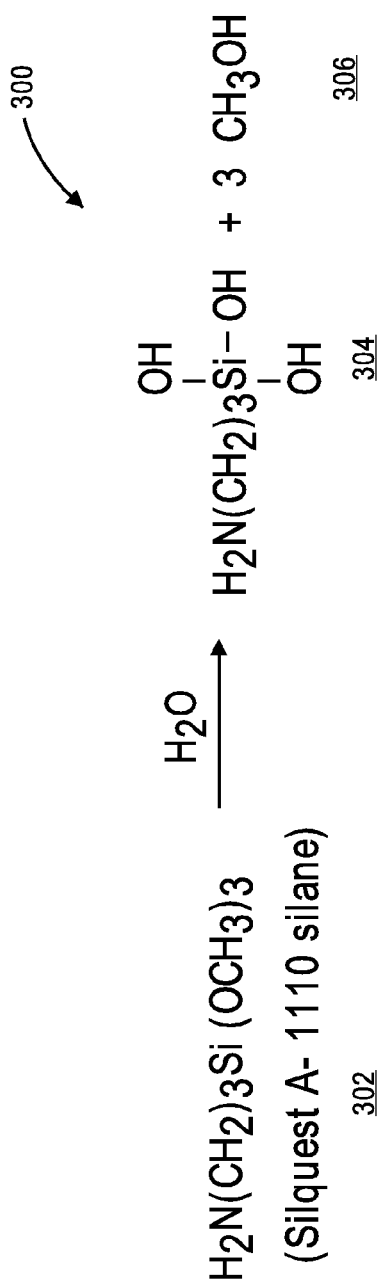
FIG. 3 illustrates a chemical reaction scheme for the hydrolysis of an adhesion promoter, in accordance with an embodiment of the present invention.

Referring to FIG. 3, an adhesion promoter 302 is hydrolyzed with water ($H_2O$) either prior to, or at the time of, inclusion in a photovoltaic module. In an embodiment, adhesion promoter 302 is Silquest A-1110 silane, as depicted in FIG. 3. Hydrolysis product 304 and by-product 306 are formed from the hydrolysis reaction. In accordance with an embodiment of the present invention, hydrolysis product 304 is used to reduce or eliminate the likelihood of delamination between an encapsulating layer and a plurality of interspaced back-side contacts in a solar cell.

In an aspect of the present invention, the hydrolysis product of an adhesion promoter may be reacted with a silanol moiety in a condensation reaction prior to, or at the time of, inclusion in a photovoltaic module. For example, FIG. 4 illustrates a chemical reaction scheme for the condensation reaction of a hydrolysis product of an adhesion promoter with a silanol moiety, in accordance with an embodiment of the present invention.

Figure 4:
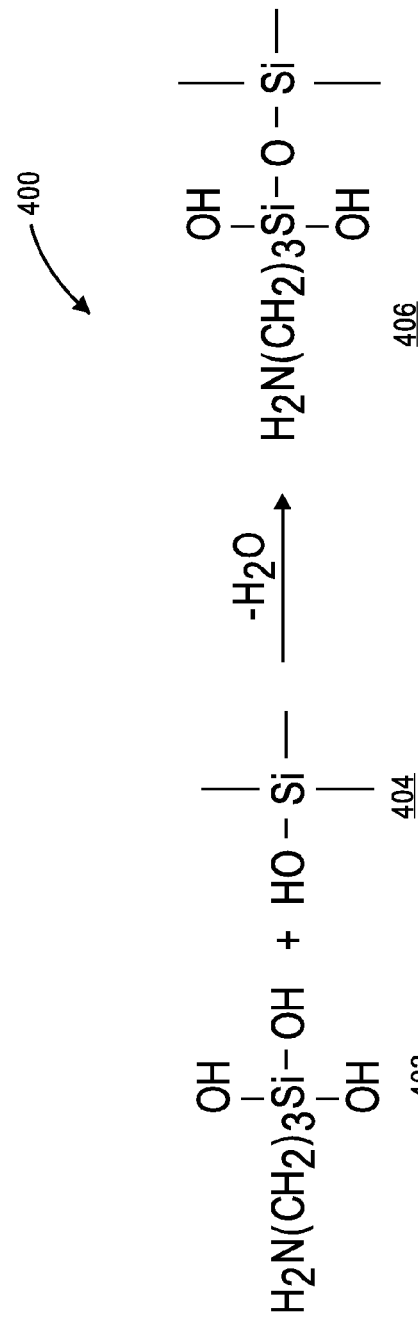
FIG. 4 illustrates a chemical reaction scheme for the condensation reaction of a hydrolysis product of an adhesion promoter with a silanol moiety, in accordance with an embodiment of the present invention.

Referring to FIG. 4, the hydrolysis product 402 of an adhesion promoter is dehydrolyzed to expel water ($H_2O$) upon reaction with a silanol moiety 404 either prior to, or at the time of, inclusion in a photovoltaic module. In an embodiment, hydrolysis product 402 is a hydrolysis product of Silquest A-1110 silane, as depicted in FIG. 4. In an embodiment, silanol moiety 404 is a terminal molecular functionality of an encapsulating layer. Bonded moiety 406 is formed from the condensation reaction. In accordance with an embodiment of the present invention, bonded moiety 406 is used to reduce or eliminate the likelihood of delamination between an encapsulating layer and a plurality of interspaced back-side contacts in a solar cell.

In accordance with an embodiment of the present invention, an adhesion promoter forms a chemical bridge within a photovoltaic module, in the form of an organic-to-inorganic interface. In one embodiment, the organic portion bonds or interacts with a polymer or organic surface. In one embodiment, a silane portion bonds or interacts with metal, glass or inorganic surfaces. In an embodiment, an organo-functionality is matched to a resin chemistry a set of hydrolyzeable groups provide substrate adhesion. In an embodiment, the direct application of an adhesion promoter to metal contacts of a solar cell is a contrasting process, with a contrasting mechanism, to including an adhesion promoter as blended in an encapsulating layer. In that embodiment, an adhesion promoter, such as a silane, blended in a polymer matrix of an encapsulating layer, can undergo untimely hydrolysis and condensation, leading to ineffective bonding at the time of lamination.

Thus, photovoltaic modules resistant to delamination and methods for fabricating photovoltaic modules resistant to delamination have been disclosed. In accordance with an embodiment of the present invention, a photovoltaic module includes a solar cell including a first surface and a second surface, the second surface including a plurality of interspaced back-side contacts. A first glass layer is coupled to the first surface by a first encapsulating layer. A second glass layer is coupled to the second surface by a second encapsulating layer. At least a portion of the second encapsulating layer is bonded directly to the plurality of interspaced back-side contacts by an adhesion promoter. In one embodiment, the adhesion promoter is composed of an aminosilane compound. In a specific embodiment, the aminosilane compound is Silquest A-1110 silane.

What is claimed is:

1. A photovoltaic module, comprising:
   a solar cell comprising a first surface and a second surface, the second surface comprising a plurality of interspaced back-side contacts;
   a first glass layer coupled to the first surface by a first encapsulating layer; and
   a second glass layer coupled to the second surface by a second encapsulating layer, wherein the second encapsulating layer is not blended with an adhesion promoter, at least a portion of the second encapsulating layer bonded directly to the plurality of interspaced back-side contacts by an adhesion promoter comprising an aminosilane compound, wherein the second encapsulating layer is in contact with the adhesion promoter where the second encapsulating layer is bonded directly to the plurality of interspaced back-side contacts, but not where the second encapsulating layer is not bonded directly to the plurality of interspaced back-side contacts.

2. The photovoltaic module of claim 1, wherein the adhesion promoter chemically bonds the second encapsulating layer to the plurality of interspaced back-side contacts.

3. The photovoltaic module of claim 1, wherein the k-value of bond strength between the second encapsulating layer and the plurality of interspaced back-side contacts is greater than approximately 45 Newtons per centimeter.

4. The photovoltaic module of claim 1, wherein the plurality of interspaced back-side contacts comprises a metal selected from the group consisting of aluminum, silver, copper and tin.

5. The photovoltaic module of claim 1, wherein the first surface of the solar cell is free from contacts.

6. A photovoltaic module, comprising:
   a solar cell comprising a first surface and a second surface, the second surface comprising a plurality of interspaced back-side contacts, the plurality of interspaced back-side contacts comprising a metal selected from the group consisting of aluminum, silver, copper and tin;
   a glass layer coupled to the first surface by a first encapsulating layer; and
   a stiff layer coupled to the second surface by a second encapsulating layer, wherein the second encapsulating layer is not blended with an adhesion promoter, at least a portion of the second encapsulating layer bonded directly to the plurality of interspaced back-side contacts by an adhesion promoter comprising an aminosilane compound, wherein the second encapsulating layer is in contact with the adhesion promoter where the second encapsulating layer is bonded directly to the plurality of interspaced back-side contacts, but not where the second encapsulating layer is not bonded directly to the plurality of interspaced back-side contacts.

7. The photovoltaic module of claim 6, wherein the stiff layer is a glass layer.

8. The photovoltaic module of claim 6, wherein the stiff layer is a plastic layer.

9. The photovoltaic module of claim 6, wherein the aminosilane compound chemically bonds the second encapsulating layer to the plurality of interspaced back-side contacts.

10. The photovoltaic module of claim 6, wherein the k-value of bond strength between the second encapsulating layer and the plurality of interspaced back-side contacts is greater than approximately 45 Newtons per centimeter.

11. The photovoltaic module of claim 6, wherein the first surface of the solar cell is free from contacts.

* * * * *